May 13, 1958 R. E. THOMPSON 2,834,886

TUNING APPARATUS

Filed Feb. 14, 1955 3 Sheets-Sheet 1

INVENTOR.
Reynald E. Thompson
BY
Mueller & Aichele
Att'ys

May 13, 1958 R. E. THOMPSON 2,834,886

TUNING APPARATUS

Filed Feb. 14, 1955 3 Sheets-Sheet 2

INVENTOR.
Reynald E. Thompson,
BY
Mueller & Aichele
Att'ys

Fig. 8.
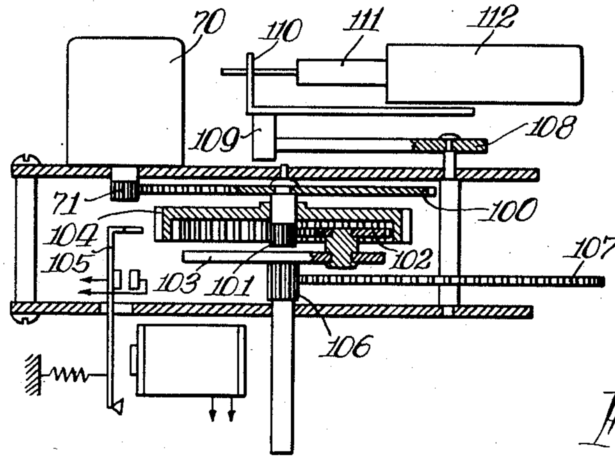
Fig. 9. Fig. 10.
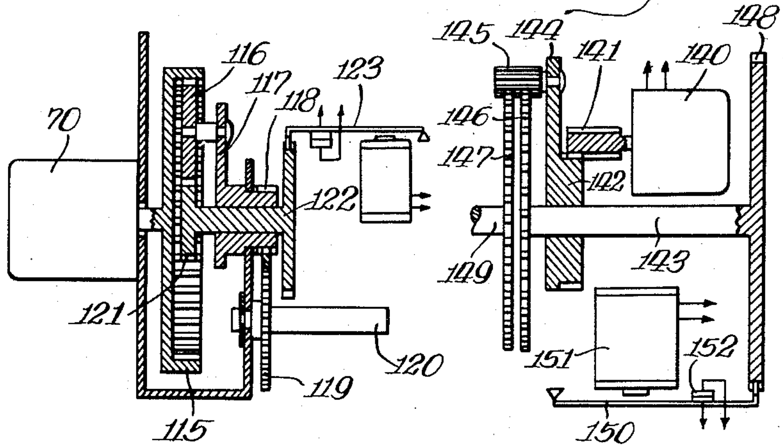
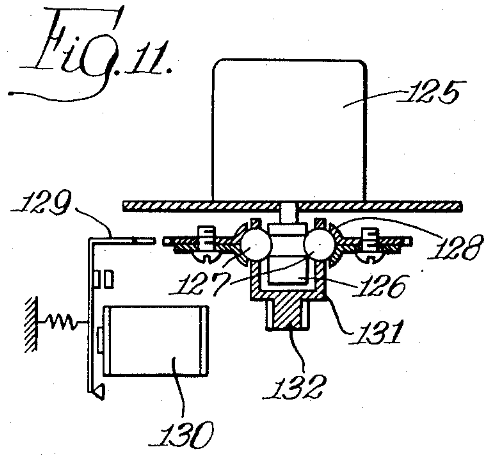
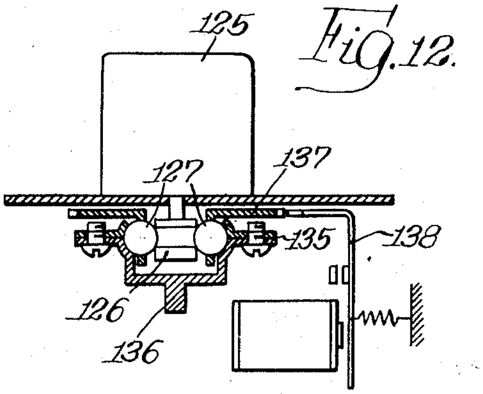
INVENTOR.
Reynald E. Thompson
BY
Mueller & Aichele
Attys.

United States Patent Office 2,834,886

Patented May 13, 1958

2,834,886

TUNING APPARATUS

Reynald E. Thompson, Mount Prospect, Ill., assignor to Motorola, Inc., Chicago, Ill., a corporation of Illinois Application February 14, 1955, Serial No. 487,989

18 Claims. (Cl. 250—40)

This invention relates generally to automatic tuners for radio receivers and the like, and more particularly to an improved motor driving arrangement for a tuner which automatically stops on signals of predetermined strength.

Automatic tuners of various types have been provided for radio receivers including tuners of the type which automatically stop when a carrier is received. Tuners of this latter type have been quite complicated and expensive, and have not been entirely satisfactory in operation. Tuners which use a solenoid for moving the tuning mechanism in one direction and springs for moving the mechanism in the other have been objectionable in that operation of the solenoid draws an objectionably heavy intermittent current, and the operation of the solenoid produces objectionable noise and vibration of the equipment. Motor driven tuners have been objectionable in that it is difficult to stop the motor quickly and/or disengage the tuning means therefrom so that the tuner may overrun the station or not be accurately tuned thereto. Further, to couple manual tuning and/or push button tuning to the automatic stop on carrier tuning has resulted in arrangements which are quite complicated.

It is therefore an object of the present invention to provide an improved mechanical system for a stop on carrier tuner.

A further object is to provide a stop on carrier or signal seeking tuner which scans the frequency band to be received in both directions and which may be started in either direction.

Another object of the invention is to provide a signal seeking tuner with a motor driven tuner mechanism having improved speed reducing means which also disengages the driving connection so that the tuner may be stopped very quickly.

A still further object of the present invention is to provide an improved arrangement for coupling a motor driven tuner and a mechanical tuner which may provide manual and/or push button operation.

A feature of this invention is the provision of a stop on carrier tuner including a motor for driving a tuning element through a gear train which includes a planetary gear structure for selectively breaking the operative connection through the gear train.

A further feature of the invention is the provision of a motor driven tuner including a planetary gear speed reducing structure having a rotatable member which when held causes a driving connection to be established between various gears of the train, and which when released rotates freely to effectively break the driving connections through the gear train.

Another feature of the invention is the provision of a gear arrangement for connecting a motor to a tuning element which facilitates connection of a treadle bar type push button tuner to the tuning element. The driving connection from the motor is arranged to permit lateral movement of the driving shafts thereof as may be required during declutching action of the push button tuner.

Still another feature of the invention is the provision of a motor driven tuner which stops on a carrier when moved in either direction, having an actuating arrangement for initiation of operation of the tuner in either direction as may be desired depending upon the frequency of the station desired with respect to the tuner setting. This may be provided in a combined structure which also reverses the driving means when the end of the frequency band is reached.

Still another feature of the invention is the provision of a planetary driving arrangement wherein coupling between the driving and driven shaft is provided by balls interconnecting the shafts, with a third member being provided which when held causes motion to be transmitted from one shaft to the other and which when allowed to freely rotate breaks the driving connection.

Further objects, features and the attending advantages of the invention will be apparent from consideration of the following description when taken in connection with the accompanying drawings in which:

Fig. 1 is a side view illustrating a tuning mechanism providing controlled motor tuning, mechanical push button tuning and manual tuning;

Fig. 1*a* is a cross-sectional view along the lines **1*a*—1*a*** of Fig. 1;

Figs. 6 to 10 illustrate further gear arrangements utilized in systems in accordance with the invention; and Figs. 11 and 12 illustrate tuner structures having equivalent driving structures utilizing balls for transmitting motion instead of gears.

In practicing the invention there is provided a motor driven tuner wherein a motor is coupled to tuning elements of a radio receiver through a gear mechanism. The mechanism may include a planetary gear structure having a rotatable member which when held causes motion to be transferred from the motor to the gear train through a sun gear pivotally mounted on the rotating member. When the rotating member is free to rotate idly, rotation of the sun gear will not cause rotation of the gear coupled thereto, but will only cause idle rotation of the supporting rotary member. The gear train may be coupled to various mechanical tuning arrangements such as a tuner of the treadle bar type having mechanically operated push buttons. In such an arrangement the motor driven gear train may be coupled to a crown gear on the manual operating shaft of the treadle bar tuner. This connection may be made by a pinion which may tilt with movement of the manual shaft resulting from declutching of the manual shaft when the push buttons are operated.

The planetary gear structure may be of various different constructions which reduce the speed of the motor to thereby provide relatively slow tuning operation and at the same time require small driving power for smooth steady operation. A rotation transferring connection using balls instead of gears may also be provided. In any case a rotatable member is held to provide energy transfer through the mechanism and is allowed to rotate to effectively break the energy coupling path. The motor may be coupled to the tuning elements to drive the same in either direction of movement, and may be adapted to be energized so that movement in a desired direction is initiated. Alternatively, the arrangement may be such that tuning is effected as the elements move in only one direction and are returned by action of a spring to the other direction when the limit of the one direction is reached.

Figures 1, 1A:
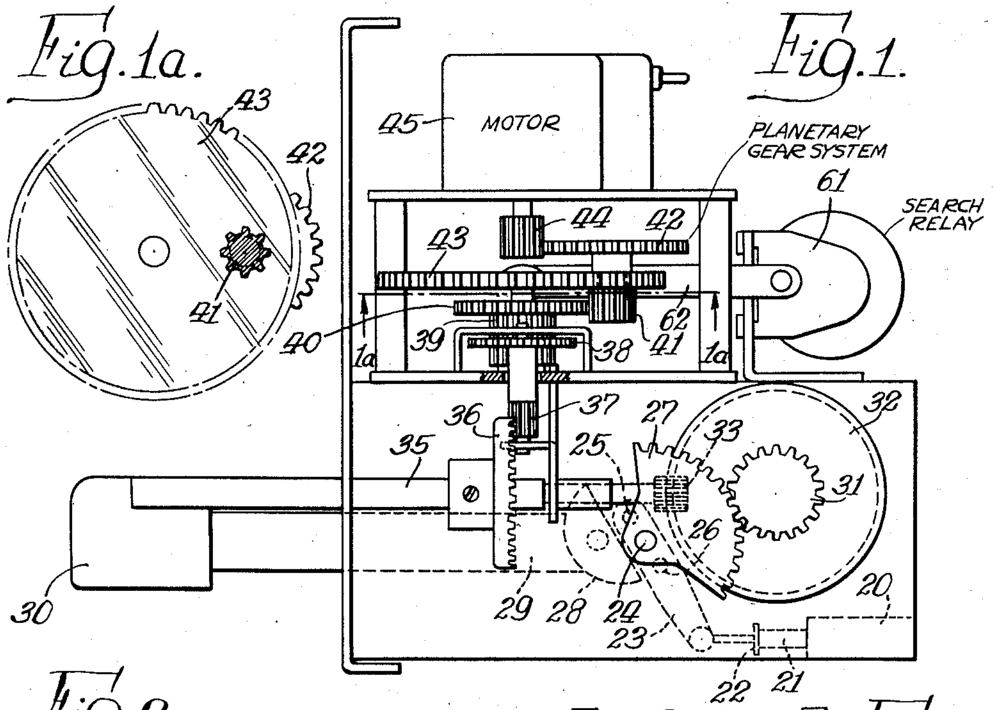

Referring now to the drawings, in Fig. 1 there is illustrated a tuner in accordance with the invention including a motor driving mechanism for signal seeking tuner operation, push button treadle bar tuning, and manual tuning, all combined in a single unit. The tuning elements of the receiver are formed by coils 20 having cores 21 movable therein. The cores are mounted on a carriage 22 which is moved by a rotating arm 23 pivoted at 24. Secured to the arm 23 and also pivotable at 24 are a treadle bar structure including the parallel members 25 and 26, and a gear segment 27. The treadle bar may be positioned by engagement therewith of segments 28 pivotally mounted on plungers 29 connected to the push buttons 30. This therefore provides movement of the carriage 22 to different positions depending upon the pivotable position of segments 28 on the plungers 29 of the push buttons 30.

The carriage 22 is also movable by rotation of the gear 31 which engages the gear segment 27. The gear 31 is connected to crown gear 32 through a clutch mechanism (not shown). The crown gear is driven by a pinion 33 supported on manual tuning shaft 35. This therefore permits control of the position of the carriage 22 by operation of the manual shaft 35.

The tuning elements can also be moved by operation of the manual shaft 35 caused by rotation of the crown gear 36. The crown gear 36 is in turn rotated by pinion 37 connected to gear 38. The gear 38 meshes with pinion 39 which is rotatable with gear 40. The gear 40 is in engagement with pinion 41 which is connected to the sun gear 42 and which is pivotally mounted on the rotatable toothed wheel 43 (Fig. 1*a*). The gear 42 meshes with pinion 44 which is connected on the shaft of motor 45. A relay 61 is provided having an arm 62 which is adapted to engage the edge of the toothed wheel 43 to hold the same against rotation.

When motor 45 is energized to drive pinion 44, and assuming that the toothed wheel 43 is held against rotation, then gear 42 is rotated by the pinion 44 to cause rotation of pinion 41 and gear 40 meshed therewith. This rotation is transferred to pinion 39, gear 38, pinion 37 and crown gear 36 to the manual shaft 35. The pinion 33 on the manual shaft rotates crown gear 32 which transmits motion through the clutch to gear 31 meshed with gear segment 33. This causes the arm 23 to pivot to move the carriage 22. Accordingly, operation of the motor causes movement of the tuning elements. When it is desired to break the connection through the gear mechanism the relay 61 operates to release the arm 62 thereof so that the toothed wheel 43 is released and allowed to rotate. Since the wheel 43 rotates freely, rotation of the sun gear 42 by the pinion 44 will cause the pinion 41 to move around the gear 40 but will not cause rotation of the gear 40. The friction on gear 40 because of the connection thereof to the manual shaft and to the tuning mechanism is much greater than the friction on the toothed wheel 43 so that the wheel 43 will spin idly and the gear 40 will not move.

Figure 2:
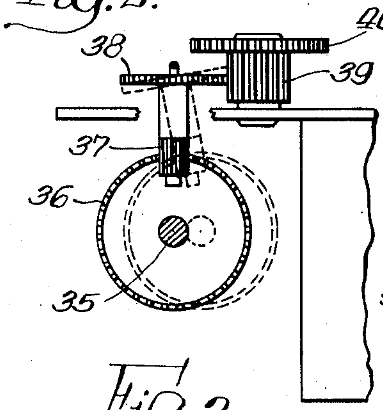
Fig. 2 is a detail view of a portion of the tuning mechanism of Fig. 1.
Figure 3:
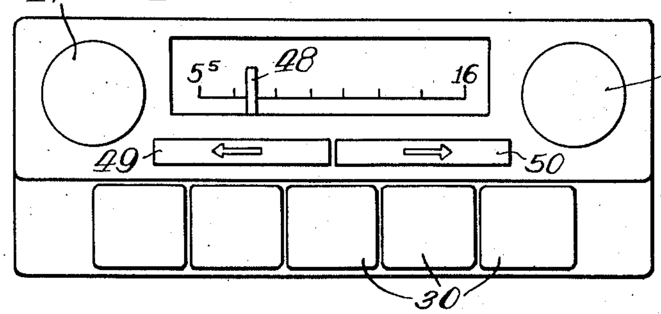
Fig. 3 illustrates the control panel for a receiver as illustrated in Figs. 1 and 2.

In Fig. 3 there is shown the front panel of a radio receiver including the tuner illustrated in Figs. 1 and 2. The push buttons 30 control the tuning through use of a treadle bar as previously described. Knob 46 is connected to the manual shaft 35 for manual tuning of the receiver. Knob 47, positioned symmetrically with knob 46 may provide the on/off switch and volume control for the receiver. As indicated, slide 48 is provided which may be coupled to the carriage 22 to show the frequency to which the receiver is tuned. Two search bars, 49 and 50, are provided for initiating the signal seeking tuner operation. The bar 49 causes movement of the tuning elements so that the indicator on the scale 48 moves to the left and the bar 50 causes movement of the tuning elements so that the indicator moves to the right.

Figure 4:
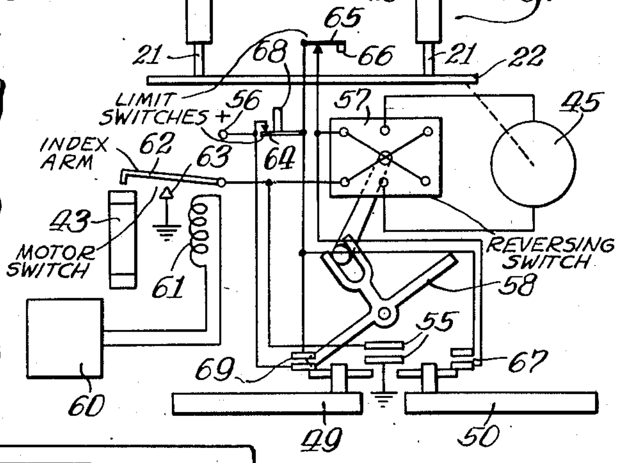
Fig. 4 is a schematic diagram of the control mechanism of the tuner of Figs. 1 to 3.

In Fig. 4 there is illustrated schematically a control system for the signal seeking tuning operation. The motor 45 is shown diagrammatically as connected to the carriage 22 which carries the cores 21 movabe in the coils 20. Movement of either of the seek bars 49 or 50 will cause the contacts 55 to close to energize the motor 45. Although an electric motor and energizing circuit is illustrated it is obvious that any suitable driving means can be used. The direction of rotation of motor 45 will depend upon which bar 49 or 50 is actuated. It will be noted that the motor is energized from the source 56 through a reversing toggle switch 57. This switch is controlled by an arm 58 positioned to be engaged by the seek bars 49 and 50. The bar 58 is shown tilted to the position resulting from operation of the seek bar 50. It will be obvious that when the bar 49 is operated the arm 58 will be pivoted clockwise to change the position of the double throw toggle switch 57.

As the motor is operated, the control system 60 coupled to the receiver will energize the relay 61 so that the arm 62 engages the grounded contact 63. This provides a continuing ground for the motor after the seek bar is released so that the motor continues to drive the tuning means. The relay arm 62 may engage the toothed rotating member 43 to prevent rotation thereof so that operation of the motor causes movement of the tuning elements as previously stated. Although an arm of the same relay which completes the motor circuit may be used to provide the mechanical latch, it is obvious that a separate electromagnetic latching means may be used for holding the toothed wheel 43 if this is desired. When a desired carrier is received the control unit 60 will de-energize the relay 61 so that the ground to the motor will be released and the toothed wheel 43 will be permitted to turn. This immediately stops the movement of the tuning element in a manner which will be understood from the preceding description.

To stop the motor at the limits of the sweep tuning operation, limit switches 64 and 65 are provided. Assuming that operation of the bar 49 causes the carriage 22 to move upwardly, then when the carriage engages the actuating element 66 of switch 65, the switch 65 will open to open the energizing circuit and stop the motor 45. Tuning to the right can be initiated by pressing bar 50 which causes the reversing switch 57 to reverse the direction of the motor so that the carriage moves down. Contacts 67 actuated by the bar 50 are bridged across the switch 65 so that the circuit is completed and the motor causes the carriage to move down. As soon as the carriage moves, the switch 65 closes to permit continued operation when the bar 50 is released. Switch 64 has an actuating element 68 engaged by carriage 22 when the other end of the movement is reached. Contacts 69 bridged across the switch 64 complete the circuit when bar 49 is depressed to initiate tuning to the left.

Figure 5:
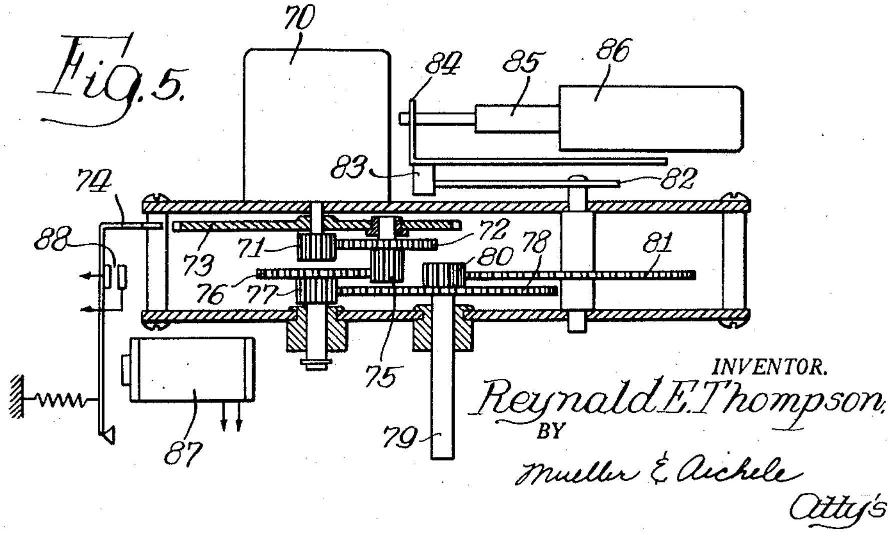
Fig. 5 shows a modified system for utilizing the tuner gear structure illustrated in Figs. 1 and 2.

Reference is now made to Fig. 5 which shows a modified signal seeking tuner system having a generally similar structure for disengaging a driving motor from tuning elements. In this structure the motor 70 drives pinion 71 which meshes with sun gear 72. The sun gear is pivotally mounted on rotatable disc 73, which has a toothed periphery adapted to be engaged by arm 74. Secured to the sun gear 72 is a pinion 75 which meshes with gear 76. Gear 76 is in turn connected to pinion 77 which drives gear 78. Gear 78 is connected to a shaft 79 to which a manual tuning control may be connected. The gear 78 is also connected to pinion 80 which drives gear 81, and gear 81 is connected to cam 82 which engages a projection 83 on carriage 84. The carriage supports and drives cores 85 movable in coils 86 to provide tuning operation in a manner well known.

In this structure, the relay 87 when energized moves the arm 74 to a position preventing rotation of the member 73. Movement of the arm 74 also closes contact 88. Accordingly, the device will operate in the manner previously described to cause rotation of the sun gear 72 about a fixed pivot when the rotatable member 73 is held against rotation. This will transfer the driving motion of the motor through the gear train to the carriage 84. However, when the arm 74 is released and rotatable member 73 is permitted to rotate about its axis, the sun gear 72 when rotated will move around the gear 76 but will not drive the same, so that the driving connection through the gear train is broken.

Figure 6:
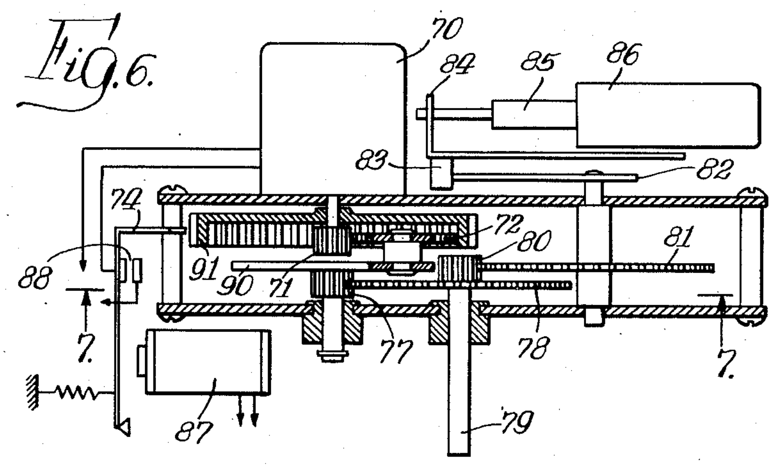
Figure 7:
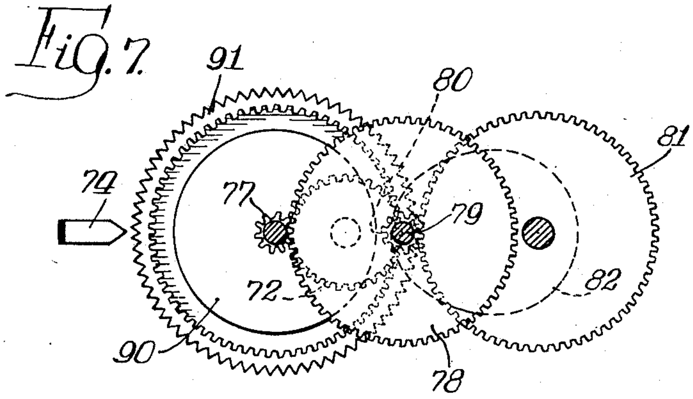

In Figs. 6 and 7 there is illustrated a further form of planetary gear structure which is suitable for use in the tuning system as has been described. The same reference numerals are used as in Fig. 5 for similar parts. The motor 70 is connected to a driving pinion 71 which is in engagement with sun gear 72 pivotally connected to rotatable disc 90. The sun gear 72 meshes with internal gear 91 which has a toothed exterior adapted to be engaged by arm 74. When the internal gear 91 is held fixed, the sun gear 72 will rotate around the pinion 71 to cause rotation of the disc 90. Connected to the disc 90 is a pinion 77 which meshes with gear 78 connected to the manual control shaft 79 in the same manner illustrated in Fig. 5. The gear 78 drives pinion 80 which meshes with gear 81, and gear 81 drives cam 82 which engages projection 83 of carriage 84. The carriage 84 moves cores 85 with respect to coil 86.

In Fig. 8 a further arrangement is shown wherein the motor 70 includes a drive pinion 71 which drives a large gear 100. This gear is connected to a pinion 101 in engagement with sun gear 102, mounted on rotatable disc 103. The sun gear engages an internal gear 104 having a toothed outer surface adapted to be engaged by arm 105. Accordingly, when the internal gear 104 is free to rotate the sun gear 102 will rotate about its axis and disc 103 will remain stationary. However, when the gear 104 is held against rotation, rotation of the sun gear 102 caused by the pinion 101 will cause the sun gear to rotate within the internal gear 104 and thereby rotate the disc 103. The disc 103 is connected to pinion 106 which drives large gear 107, and gear 107 is connected to cam 108 which engages projection 109 on carriage 110. The carriage controls the position of cores 111 movable in coils 112. It will be obvious that this arrangement provides generally the same action as that of previous embodiments.

A still further turning arrangement is illustrated in Fig. 9. In this figure the motor 70 is connected to a large internal gear 115. Engaging the gear 115 is a sun gear 116 mounted on a rotatable arm 117. The arm 117 is connected to gear 118 which drives gear 119. Gear 119 is connected to a shaft 120 which may be connected to the tuning apparatus in a manner illustrated in the preceding figures. The sun gear 116 is also in engagement with gear 121 which is connected to toothed disc 122. Toothed disc 122 is adapted to be held in fixed position by arm 123. When the disc 122 is held fixed and the gear 121 is correspondingly held fixed, rotation of the internal gear 115 will cause the sun gear 116 to move around the gear 121 to thereby cause rotation of the arm 117 and the gear 118 connected thereto. This movement will be coupled through gear 119 to the shaft 120. When, on the other hand, the disc 122 is released by release of arm 123, rotation of the internal gear 115 will rotate gear 116 and cause the same to rotate gear 121 which is now free to move. Accordingly, gear 116 will rotate about a fixed pivot so that the arm 117 will remain in fixed position and no motion will be transferred through gears 118 and 119.

In Fig. 10 there is shown a further gear driving arrangement which has the advantage that great reduction of speed is accomplished by the use of relatively few members. The motor 140 has a pinion 141 connected to the drive shaft thereof which drives a gear member 142 freely mounted on shaft 143. The gear member 142 has an extension 144 to which a sun gear 145 is rotatably mounted. The sun gear 145 is a pinion which engages the gears 146 and 147, concentric with each other and with the gear 142. Although both gears 146 and 147 are coupled to pinion 145, these two gears have different numbers of teeth for a reason to be explained. The gear 146 is connected to the shaft 143 to which is also connected a toothed wheel 148. The gear 147 is connected to the output shaft 149 of the tuner. For holding the toothed wheel 148 against rotation there is provided an arm 150 operated by a relay 151 which may be connected in a control or trigger circuit for the tuner. The arm 150 may also operate contacts 152 in a manner as previously described.

Considering now the operation of the system of Fig. 10, operation of the motor drives the pinion 141 to in turn drive the gear member 142. When the toothed wheel 148 is held fixed, the gear 146 will similarly be held fixed and the pinion 145 will rotate about the gear 146. As stated above, gear 147 has a different number of teeth than the gear 146 so that as the pinion 145 rotates around the fixed gear 146, gear 147 will be rotated slowly, with the speed thereof depending upon the speed of the peripheral movement of the sun gear (pinion) 145 and the difference in numbers of teeth of the gears 146 and 147. It will be obvious that by making a difference of only one tooth between the gears, the gear 147 will only move one tooth position as the sun gear 145 makes a complete revolution. This will, therefore, provide very slow motion of the shaft 149. It is entirely practical however to provide a difference in number of teeth greater than one to provide a lesser reduction of speed if desired. When the relay 151 releases so that the toothed wheel 148 is free to move, the load on the gear 146 will be very slight so that this gear will move freely. Since the shaft 149 is connected to the tuning element, the load on the gear 147 will be greater than that on gear 146 so that as between these gears, gear 146 will be the freer to turn of the two. Accordingly when motor 140 rotates gear member 142, the sun gear 145 will now move around gear 147 which remains fixed causing slow speed movement of the gear 146. This, therefore permits rapid disengagement of the motor drive when desired as has been previously described in the other embodiments.

Figs. 11 and 12 show additional modifications of the tuning drive mechanism wherein planetary type arrangements using balls instead of gears are provided. In Fig. 11 the driving motor 125 is connected to an inner race 126, and balls 127 are provided between the inner race 126 and an outer race 127. The outer race includes a toothed edge adapted to be engaged by arm 129 controlled by relay 130. A ball retainer member 131 is connected to a shaft 132 to drive the same. In this arrangement when the outer race 128 is held by arm 129, rotation of the inner race 126 will cause rotation of the balls causing the same to roll within the outer race. This will cause the retainer 131 to rotate to thereby rotate the shaft 132. The shaft 132 may include a pinion gear for driving a gear train as described in the previous embodiments. When, however, the outer race 128 is free to rotate, the balls 127 will rotate about fixed axes and the balls will not move around within the inner race 126. Accordingly, the retainer 131 will remain in fixed position and the shaft 132 connected thereto will also remain in fixed position.

The arrangement in Fig. 12 provides the same operation as that of Fig. 11 but is of a somewhat different construction. The motor 125 is connected to inner race 126 generally similar to Fig. 11. The outer race 135 is connected to a driving shaft 136 to transfer motion from the motor thereto. The retainer 137 has a toothed edge adapted to be engaged by the relay arm 138. Accordingly, when the retainer 137 is held against rotation, the balls are rotated by the inner race 126 about fixed axes and thereby cause rotary movement of the outer race 135. This will cause rotation of the shaft 136. However, when the retainer 137 is free to rotate, rotation of the inner race 127 will cause the balls 127 to rotate within the outer race and will move around the inner race 126. This will carry the retainer 137 in a rotary motion. However, as the outer race 135 remains stationary the shaft 136 connected thereto will remain stationary so that the motor will be disengaged from the tuning mechanism.

In addition to the use of gears and balls, planetary drive structures using wheels could be used. These structures may be similar to those illustrated in Figs. 6–10 but with wheels having surfaces engaging each other and driving each other by friction instead of positive gear drives as illustrated. The friction driving action is generally the same as that provided by the ball structures of Figs. 11 and 12.

It will be apparent that in all of the above arrangements the free movement of the toothed member depends upon this member having less load than the gear train connected to the tuning mechanism. This will normally be the case since the tooth member is not coupled to other members and only the friction resulting from the pivotable mounting is present. This can be made very small so that the member will rotate immediately when released to thereby stop the transfer of motion from the motor to the tuning element.

Although several embodiments of the invention have been disclosed, it will be obvious that many variations and combinations of the structures illustrated can be used. For example, the means for engaging the rotatable member of the planetary structure can be a separate relay or other electromagnetic unit instead of the main operating relay of the signal seeking tuner system. Also the engaging arm of such relay may be a flexible finger with friction material thereon so that the rotatable member is stopped at any point and not merely when a tooth is reached.

The systems disclosed have the great advantage that the driving connection is stopped very quickly so that undesired overrun does not take place. The planetary release structure may also provide at least a part of the speed reduction required in motor tuner drives to thereby simplify the overall structure.

As has been illustrated, the signal seeking tuner driving mechanism can be combined with a continuous manual tuning control and/or mechanical push button tuning means to provide a structure having all these facilities and which is relatively simple and compact. The system may provide starting of the sweep tuning operation in either direction so that a desired station can be quickly reached. The disengageable driving connection or planetary structure can be of various different configurations using gears, ball members or wheels for providing the driving connection.

I claim:

1. A motor operated tuner for a radio receiver adapted to provide tuning over a range of frequencies and to stop the tuning in response to a predetermined signal, said tuner including in combination, direct current supply means, direct current motor means, relay means for connecting said motor means to said supply means, movable tuner means for the receiver, gear means interconnecting said motor means and said tuner means for causing said tuner means to sweep the frequency range in response to rotation of said motor means, said gear means including a rotatable member which is effective to cause transfer of motion through said gear means when said rotatable member is held against rotation, said rotatable member being effective to disengage said gear means when allowed to rotate, said relay means including a portion adapted to engage said rotatable member when said relay means is actuated to prevent rotation thereof, with said relay means being actuated when tuning is initiated to energize said motor means, and to prevent rotation of said rotatable member so that said tuner means is driven by said motor means, and manual tuning means connected to said gear means between said rotatable member and said tuner means for operating said tuner means.

2. Tuning apparatus for a radio receiver adapted to provide tuning over a range of frequencies and to stop the tuning in response to a predetermined signal, said tuning apparatus including in combination energy supply means, driving means, means for connecting said driving means to said supply means, movable tuner means for the receiver, gear means interconnecting said driving means and said tuner means for causing said tuner means to sweep the frequency range in response to operation of said driving means, said gear means including a planetary gear structure having a rotatable member which is effective to cause transfer of motion through said planetary gear structure when said rotatable member is held against rotation, said planetary gear structure being effective to disengage said gear means when said rotatable member is free to rotate, said connecting means including a portion adapted to engage said rotatable member when said connecting means is actuated to prevent rotation thereof, said connecting means being actuated when tuning is initiated to energize said driving means and hold said rotatable member so that said driving means drives said tuner means, and manual tuning means connected to said gear means between said rotatable member and said tuner means for operating said tuner means.

3. Tuning apparatus in accordance with claim 2 wherein said gear means includes a pinion gear connected to said driving means, a sun gear pivotally mounted on said rotatable member, and a second pinion coaxially connected to said sun gear and coupled to said manual tuning means.

4. Tuning apparatus in accordance with claim 2 wherein said rotatable member includes an internal gear portion, and said gear means includes a pinion coaxial with said internal gear portion coupled to said driving means, a disc mounted coaxially with said pinion having a sun gear pivotally mounted thereon in engagement with said pinion and said internal gear portion, and a second pinion coaxially connected to said disc and coupled to said manual tuning means.

5. Tuning apparatus in accordance with claim 2 wherein said rotatable member includes a disc portion adapted to cooperate with said connecting means and a gear portion, and said gear means includes an internal gear connected to said driving means and coaxial with said gear portion, an arm rotatable about the axis of said gear portion and having a sun gear pivotally mounted thereon and cooperating with said internal gear and said gear portion, and a gear connected to said arm and coupled to said manual tuning means.

6. Tuning apparatus for a radio receiver adapted to provide tuning over a range of frequencies and to stop the tuning in response to a predetermined signal, said tuning apparatus including in combination, energy supply means, driving means, means for connecting said driving means to said supply means, movable tuner means for the receiver, and rotary speed reducing means interconnecting said driving means and said tuner means for causing said tuner means to sweep the frequency range in response to operation of said driving means, said rotary means including a rotatable member which is effective to cause transfer of motion through said rotary means when said rotatable member is held against rotation, said rotatable member being effective to disengage said rotary means when allowed to rotate, said connecting means including a portion adapted to physically engage said rotatable member when said connecting means is actuated to prevent rotation thereof, with said connecting means being actuated when tuning is initiated to energize said driving means, and to prevent rotation of said rotatable member so that said tuner means is operatively connected to said driving means.

7. Tuning apparatus in accordance with claim 6 in which said rotary means includes inner and outer race parts, a plurality of balls positioned between said race parts, and a retaining member in engagement with said balls, with one of said race parts being a portion of said rotatable member.

8. A tuner for a radio receiver adapted to provide continuous manual tuning over a range of frequencies, push button tuning of present frequencies within the range, and motor operated tuning which automatically stops in response to the reception of a carrier wave of a predetermined strength within the frequency range, said tuner including in combination, movable tuner means for the receiver, a first shaft coupled to said tuner means and continuously rotatable to change the position of said tuner means, treadle bar means including a second shaft coupled to said tuner means, a plurality of push button units including plunger portions having cam means thereon adapted to engage said treadle bar means for moving the same and rotating second shaft to thereby change the position of said tuner means, and motor means including direct current supply means, a direct current motor unit, relay means for connecting said motor unit to said supply means, and gear means interconnecting said motor unit and said first shaft for causing said tuner means to sweep the frequency range in response to rotation of said motor unit, said gear means including a planetary gear structure having a rotatable member which is effective to cause transfer of motion through said planetary gear structure when said rotatable member is held against rotation, said planetary gear structure being effective to disengage said gear means when said rotatable member is free to rotate, said relay means including a portion adapted to engage said rotatable member when said relay is actuated to prevent rotation thereof, said relay means being adapted to be actuated when tuning is initiated to energize said motor unit and hold said rotatable member so that said motor unit drives said tuner means, said relay means being adapted to be released when a carrier wave of a predetermined strength is received to release said rotatable member and thereby disengage said gear means.

9. A tuner for a radio receiver adapted to provide continuous manual tuning over a range of frequencies, push button tuning of present frequencies within the range, and motor operated tuning which automatically stops in response to the reception of a carrier wave of a predetermined strength within the frequency range, said tuner including in combination, movable tuner means for the receiver, a first shaft coupled to said tuner means and continuously rotatable to change the position of said tuner means, treadle bar means including a second shaft coupled to said tuner means, a plurality of push button units including plunger portions having cam means therein adapted to engage said treadle bar means for moving the same and rotating said second shaft to thereby change the position of said tuner means, motor means including electric current supply means, an electric motor unit, relay means for connecting said motor unit to said supply means, gear means interconnecting said motor unit and said first shaft for causing said tuner means to sweep the frequency range in response to rotation of said motor unit, said gear means including a planetary gear structure having a rotatable member which is effective to cause transfer of motion through said planetary gear structure when said rotatable member is held against rotation, said planetary gear structure being effective to disengage said gear means when said rotatable member is free to rotate, said relay means including a portion adapted to engage said rotatable member when said relay is actuated to prevent rotation thereof, and control means operable to initiate tuning action by actuating said relay means to thereby energize said motor unit and hold said rotatable member so that said motor unit drives said tuner means, said control means releasing said relay means in response to a carrier wave of a predetermined strength to release said rotatable member and thereby disengage said gear means.

10. A tuner for a radio receiver adapted to provide continuous manual tuning over a range of frequencies, push button tuning of present frequencies within the range, and motor operated tuning which automatically stops in response to the reception of a carrier wave within the frequency range of a predetermined strength, said tuner including in combination, movable tuning means for the receiver, a first shaft coupled to said tuning means and continuously rotatable to change the position of said tuning means, treadle bar means including a second shaft coupled to said tuning means, a plurality of push button units including plunger portions having cam means therein adapted to engage said treadle bar means for moving the same and rotating said second shaft to thereby change the position of said tuning means, disengageable means interconnecting said first shaft and said tuning means, said plunger portions of said push button units operating to actuate said disengageable means to release said first shaft from said tuning means and causing incidental displacement of the axis of said first shaft, and motor means including electric current supply means, an electric motor unit, relay means for connecting said motor unit to said supply means, and gear means interconnecting said motor unit and said first shaft for causing said tuning means to sweep the frequency range in response to rotation of said motor unit, said gear means including a planetary gear structure having a rotatable member which is effective to cause transfer of motion through said planetary gear structure when said rotatable member is held against rotation, said planetary gear structure being effective to disengage said gear means when said rotatable member is free to rotate, said relay means including a portion for selectively engaging said rotatable member when said relay is actuated to prevent rotation thereof, said gear means including a crown gear mounted on said first shaft and a pinion mounted for limited arcuate movement to accommodate displacement of said first shaft.

11. A tuner for a radio receiver adapted to provide continuous manual tuning over a range of frequencies, push button tuning of present frequencies within the range, and motor operated tuning which automatically stops in response to the reception of a carrier wave within the frequency range of a predetermined strength, said tuner including in combination, movable tuning means for the receiver, a first shaft coupled to said tuning means and continuously rotatable to change the position of said tuning means, treadle bar means including a second shaft coupled to said tuning means, a plurality of push button units including plunger portions having cam means therein adapted to engage said treadle bar means for moving the same and rotating said second shaft to thereby change the position of said tuning means, disengageable means connecting said first shaft and said tuning means, said plunger portions of said push button units operating to actuate said disengageable means to release said first shaft from said tuning means and causing incidental displacement of the axis of said first shaft, and motor means including electric current supply means, an electric motor unit, relay means for connecting said motor unit to said supply means, rotary drive means interconnecting said motor unit and said first shaft for causing said tuning means to sweep the frequency range in response to rotation of said motor unit, said drive means including a rotatable member which is effective to cause transfer of motion through said drive means when said rotatable member is held against rotation and which is effective to disengage said drive means when said rotatable member is free to rotate, said relay means including a portion for selectively engaging said rotatable member when said relay is actuated to prevent rotation thereof, said drive means including a crown gear mounted on said first shaft and a pinion mounted for limited arcuate movement to accommodate displacement of said first shaft, and control means operable to initiate tuning action by actuating said relay means to thereby energize said motor unit and hold said rotatable member so that said motor unit drives said tuning means, said control means releasing said relay means in response to a carrier wave of a predetermined strength to release said rotatable member and thereby disengage said drive means.

12. A motor operated tuner for a radio received adapted to provide tuning over a range of frequencies and to stop the tuning in response to a predetermined signal, said tuner including in combination, direct current supply means, direct current motor means, means for selectively connecting said motor means to said supply means including relay means and reversing switch means for selectively applying current to said motor means in opposite polarities to cause rotation of said motor means in opposite directions, movable tuner means for the receiver, speed reducing means interconnecting said motor means and said tuner means for causing said tuner means to sweep the frequency range in response to rotation of said motor means, said speed reducing means including a rotatable member which is effective to cause transfer of motion through said speed reducing means when said rotatable member is held against rotation, said rotatable member being effective to disengage said speed reducing means when allowed to rotate, said relay means including a portion adapted to engage said rotatable member when said relay is actuated to prevent rotation thereof, with said relay means being actuated when tuning is initiated to energize said motor means, and to prevent rotation of said rotatable member so that said tuner means is driven by said motor means, and control means for initiating operation of said tuner including means for selectively operating said reversing switch means to control the direction of rotation thereof and thereby control the direction of movement of said tuner means.

13. A motor operated tuner for a radio receiver adapted to provide tuning over a range of frequencies and to stop the tuning in response to a predetermined signal, said tuner including in combination, direct current supply means, direct current motor means, means for selectively connecting said motor means to said supply means including relay means, reversing switch means and limit switch means, movable tuner means for the receiver, gear means interconnecting said motor means and said tuner means for causing said tuner means to sweep the frequency range in response to rotation of said motor means, said gear means including a rotatable member which is effective to cause transfer of motion through said gear means when said rotatable member is held against rotation, said rotatable member being effective to disengage said gear means when allowed to rotate, said relay means including a portion adapted to engage said rotatable member when said relay is actuated to prevent rotation thereof, with said relay means being actuated when tuning is initiated to energize said motor means, and to prevent rotation of said rotatable member so that said tuner means is driven by said motor means, and control means for initiating operation of said tuner including means for selectively operating said reversing switch means to control the direction of rotation thereof and thereby control the direction of initial movement of said tuner means, said limit switch means disconnecting said motor means from said supply means when said tuner means reaches the frequencies at the extremities of the tuning range.

14. A motor operated tuner for a radio receiver adapted to provide tuning over a range of frequencies and to stop the tuning in response to a signal of a predetermined strength, said tuner including in combination, electric current supply means, reversible electric motor means, means for selectively connecting said motor means to said supply means including relay means and reversing switch means, movable tuning means for the receiver, gear means interconnecting said motor means and said tuning means for causing said tuning means to sweep the frequency range in response to rotation of said motor means, said gear means including a rotatable member which is effective to cause transfer of motion through said gear means when said rotatable member is held against rotation, said rotatable member being effective to disengage said gear means when allowed to rotate, said relay means including a portion adapted to engage said rotatable member when said relay is actuated to prevent rotation thereof so that said tuning means is driven by said motor means, and control means for initiating operation of said tuner means including actuating means for selectively operating said reversing switch means to control the direction of initial rotation of said motor means and thereby control the direction of movement of said tuning means, said control means energizing said relay means in response to actuation of said actuating means to connect said motor means to said supply means and to hold said rotatable member to thereby provide an operative connection through said gear means, said control means releasing said relay means in response to a signal of a predetermined strength to immediately break the connection through said gear means and stop said tuning means.

15. A motor operated tuner for a radio receiver adapted to provide tuning over a range of frequencies and to stop the tuning in response to a signal of a predetermined strength, said tuner including in combination, electric current supply means, reversible electric motor means, means for selectively connecting said motor means to said supply means including relay means and reversing switch means, movable tuning means for the receiver operable between first and second frequencies which define the range of frequencies, gear means interconnecting said motor means and said tuning means for causing said tuning means to sweep the frequency range in response to rotation of said motor means, said gear means including a rotatable member which is effective to cause transfer of motion through said gear means when said rotatable members is held against rotation, said rotatable member being effective to disengage said gear means when allowed to rotate, said relay means including a portion adapted to engage said rotatable member when said relay is actuated to prevent rotation thereof so that said tuning means is driven by said motor means, and control means for initiating operation of said tuner means including first and second actuating means for selectively operating said reversing switch means to cause rotation of said motor means in first and second opposite directions and thereby control the direction of movement of said tuning means, said actuating means including contact means for energizing said relay means to connect said motor means to said supply means and to hold said rotatable member to thereby provide a driving connection through said gear means, said control means including a portion operating in response to the reception of a signal of a predetermined strength to release said relay means and immediately break the driving connection through said gear means and stop said tuner means, said control means including limit switches positioned to be engaged by said tuning means when said tuning means reaches one of said first and second frequencies to disconnect said motor from said supply means, and switch means coupled to said actuating means for bridging said limit switches to connect said motor means in response to operation of said activating means causing operation of said motor means in the direction to move said tuning means away from said one frequency.

16. A motor operated tuner for a radio receiver adapted to provide tuning over a range of frequencies and to stop the tuning in response to reception of a signal of a predetermined strength, said tuner including in combination, electric current supply means, reversible electric motor means, means for selectively connecting said motor means to said supply means including magnetic means and reversing switch means, movable tuning means for the receiver, rotatable drive means interconnecting said motor means and said tuning means for causing said tuning means to sweep the frequency range in response to rotation of said motor means, said drive means including a rotatable member which is effective to cause transfer of motion through said drive means when said rotatable member is held against rotation, said rotatable member being effective to disengage said drive means when allowed to rotate, said magnetic means including a portion movable to engage said rotatable member to prevent rotation thereof so that said tuning means is driven by said motor means, and control means for initiating operation of said tuning means including means for selectively operating said reversing switch means to control the direction of rotation of said motor means and thereby control the direction of movement of said tuning means, said control means energizing said magnetic means to hold said rotatable member and thereby provide an operative connection through said drive means to cause movement of said tuning means and releasing said relay means to immediately break the connection through said drive means and stop said tuning means.

17. Tuning apparatus for a radio receiver adapted to provide tuning over a range of frequencies and to stop the tuning in response to a predetermined signal, said tuning apparatus including in combination, energy supply means, driving means, means for connecting said driving means to said supply means, movable tuner means for the receiver, and speed reducing gear means interconnecting said driving means and said tuner means for causing said tuner means to sweep the frequency range in response to operation of said driving means, said gear means including a rotary member coupled to said driving means and having a pinion rotatably mounted thereon spaced from the axis thereof, first and second gear members coaxial with said rotary member and having peripheral teeth intermeshed with said pinion, said first and second gear members having the same diameter and having different numbers of teeth, means coupling said second gear member to said movable tuner means, and means for selectively holding said first gear member against rotation to cause transfer of motion from said rotary member through said pinion to said second gear member, said first gear member being effective to disengage said gear means when allowed to rotate, said holding means being actuated when tuning is initiated to prevent rotation of said first gear member so that said tuner means is operatively connected so said driving means, with said holding means being released when the predetermined signal is received to stop driving movement of said tuner means.

18. Tuning apparatus for a radio receiver adapted to provide tuning over a range of frequencies and to stop the tuning in response to a predetermined signal, said tuning apparatus including in combination, energy supply means, driving means, means for connecting said driving means to said supply means, movable tuner means for the receiver, and speed reducing gear means interconnecting said driving means and said tuner means for causing said tuner means to sweep the frequency range in response to operation of said driving means, said gear means including a pinion coupled to said driving means a rotary member having a gear portion in engagement with said pinion and a sun gear rotatably mounted on said rotary member spaced from the axis thereof, first and second gear members having the same diameter and coaxially mounted with said rotary member, said first and second gear members having peripheral teeth intermeshed with said pinion with said gear members having different numbers of teeth, a toothed wheel connected to said first gear member, means coupling said second gear member to said movable tuner means, and control means for selectively holding said toothed wheel against rotation to thereby hold said first gear member and cause transfer of motion from said driving means to said second gear member as said sun gear rotates about said first gear member, said sun gear rotating about said second gear member when said first gear member is free to rotate to thereby effectively disengage said gear means, said control means being actuated when tuning is initiated to prevent rotation of said toothed wheel and said first gear member so that said tuner means is operatively connected to said driving means, with said control means being released when the predetermined signal is received to stop driving movement of said tuner means.

References Cited in the file of this patent

UNITED STATES PATENTS

| | | |
|---|---|---|
| 2,207,467 | Muller | July 9, 1940 |
| 2,226,751 | Van Loon | Dec. 31, 1940 |
| 2,499,967 | Nicholson | Mar. 7, 1950 |
| 2,529,677 | Case | Nov. 14, 1950 |
| 2,701,330 | Schwarz | Feb. 1, 1955 |
| 2,775,895 | Kearney | Jan. 1, 1957 |